United States Patent
Bober

(10) Patent No.: US 9,267,999 B2
(45) Date of Patent: Feb. 23, 2016

(54) TEST SYSTEM FOR A BATTERY PACK AND A METHOD FOR TESTING THE BATTERY PACK

(71) Applicant: Greg Bober, Saint Clair Shores, MI (US)

(72) Inventor: Greg Bober, Saint Clair Shores, MI (US)

(73) Assignee: LG Chem, Ltd., Seoul (KR)

( * ) Notice: Subject to any disclaimer, the term of this patent is extended or adjusted under 35 U.S.C. 154(b) by 585 days.

(21) Appl. No.: 13/665,960

(22) Filed: Nov. 1, 2012

(65) Prior Publication Data

US 2014/0117996 A1 May 1, 2014

(51) Int. Cl.
| | |
|---|---|
| *G01N 27/416* | (2006.01) |
| *G01R 31/36* | (2006.01) |
| *H01M 10/44* | (2006.01) |
| *H02J 7/00* | (2006.01) |
| *H01M 10/42* | (2006.01) |
| *H01M 10/48* | (2006.01) |

(52) U.S. Cl.
CPC ....... *G01R 31/3631* (2013.01); *H01M 10/4285* (2013.01); *H01M 10/441* (2013.01); *H01M 10/486* (2013.01); *H02J 7/0026* (2013.01); *H02J 7/0031* (2013.01); *H01M 10/4207* (2013.01); *H01M 10/482* (2013.01); *H01M 2220/20* (2013.01)

(58) Field of Classification Search
USPC .......................................................... 324/426
See application file for complete search history.

(56) References Cited

U.S. PATENT DOCUMENTS

| | | | |
|---|---|---|---|
| 6,225,788 B1 * | 5/2001 | Kouzu | B60L 3/0046 320/150 |
| 8,159,184 B2 | 4/2012 | Emori et al. | |
| 2008/0103709 A1 | 5/2008 | Yun et al. | |
| 2009/0066292 A1 * | 3/2009 | Jao | H01M 10/0413 320/119 |
| 2009/0230921 A1 * | 9/2009 | Hsu et al. | 320/116 |
| 2010/0320969 A1 | 12/2010 | Sakakibara et al. | |

FOREIGN PATENT DOCUMENTS

| | | |
|---|---|---|
| EP | 0964470 A1 | 5/1998 |
| EP | 2418752 A1 | 6/2010 |
| JP | 2012210139 | 10/2012 |
| KR | 20030038992 | 5/2003 |
| KR | 20100019256 | 2/2010 |
| KR | 20110132269 | 10/2011 |
| KR | 20120076068 | 7/2012 |

OTHER PUBLICATIONS

European Search Report for PCT/KR2013009660 dated Sep. 24, 2015.

* cited by examiner

*Primary Examiner* — Robert Grant
(74) *Attorney, Agent, or Firm* — Buckert Patent & Trademark Law Firm, PC; John F. Beckert

(57) ABSTRACT

A test system for a battery pack having at least first and second battery modules is provided. The system includes a high voltage service disconnect assembly having a housing and an electrically-actuated switch. The system further includes a microprocessor that generates a first signal to induce the switch to have a closed operational position to electrically couple the first battery module to the second battery module. The sensor generates a second signal associated with the battery pack. The microprocessor stops generating the first signal to induce the switch to have an open operational position to electrically decouple the first battery module from the second battery module when the first signal is greater than a threshold level.

24 Claims, 6 Drawing Sheets

```
┌─────────────────────────────────────────────────────────────────────┐
│ USER PROVIDES A HIGH VOLTAGE SERVICE DISCONNECT ASSEMBLY HAVING A   │
│ HOUSING, FIRST AND SECOND CONDUCTIVE PINS, AND AN ELECTRICALLY-     │──180
│ ACTUATED SWITCH, THE HOUSING BEING CONFIGURED TO SECURE THE FIRST   │
│ AND SECOND CONDUCTIVE PINS THEREIN, THE ELECTRICALLY-ACTUATED       │
│ SWITCH BEING ELECTRICALLY COUPLED IN SERIES BETWEEN THE FIRST AND   │
│ SECOND CONDUCTIVE PINS, THE FIRST CONDUCTIVE PIN CONFIGURED TO BE   │
│ REMOVABLY ELECTRICALLY COUPLED TO A VOLTAGE TERMINAL OF THE FIRST   │
│ BATTERY MODULE, THE SECOND CONDUCTIVE PIN CONFIGURED TO BE          │
│ REMOVEABLY ELECTRICALLY COUPLED TO A VOLTAGE TERMINAL OF THE        │
│ SECOND BATTERY MODULE                                               │
└─────────────────────────────────────────────────────────────────────┘
                                    ↓
┌─────────────────────────────────────────────────────────────────────┐
│ MICROPROCESSOR GENERATES A FIRST SIGNAL TO INDUCE THE ELECTRICALLY- │──181
│ ACTUATED SWITCH TO HAVE A CLOSED OPERATIONAL POSITION TO            │
│ ELECTRICALLY COUPLE THE FIRST BATTERY MODULE TO THE SECOND BATTERY  │
│ MODULE                                                              │
└─────────────────────────────────────────────────────────────────────┘
                                    ↓
                ╱ ARE CHARGING TESTS TO BE PERFORMED ON ╲ 182
               ╱  BATTERY PACK? &                       ╲
    (F)──────▶╱   FIRST TEST FLAG ≠ FIRST VALUE? &       ╲ NO ──▶(A)
              ╲   SECOND TEST FLAG ≠ FIRST VALUE? &      ╱
               ╲  THIRD TEST FLAG ≠ FIRST VALUE? &      ╱
                ╲ FOURTH TEST FLAG ≠ FIRST VALUE?      ╱
                                    ↓ YES
┌─────────────────────────────────────────────────────────────────────┐
│ MICROPROCESSOR GENERATES A CONTROL SIGNAL TO INDUCE THE BATTERY     │──184
│ CYCLING DEVICE TO CHARGE THE FIRST AND SECOND BATTERY MODULES OF    │
│ THE BATTERY PACK                                                    │
└─────────────────────────────────────────────────────────────────────┘
                                    ↓
┌─────────────────────────────────────────────────────────────────────┐
│ BATTERY PACK TEMPERATURE SENSOR GENERATES A SECOND SIGNAL INDICATIVE│──186
│ OF A TEMPERATURE LEVEL OF THE BATTERY PACK                          │
└─────────────────────────────────────────────────────────────────────┘
                                    ↓
              ╱ SECOND SIGNAL > FIRST THRESHOLD LEVEL? ╲  NO ──▶(B)
                                    ↓ YES
                                   188
┌─────────────────────────────────────────────────────────────────────┐
│ MICROPROCESSOR STOPS GENERATING THE FIRST SIGNAL TO INDUCE THE      │──190
│ ELECTRICALLY-ACTUATED SWITCH TO HAVE AN OPEN OPERATIONAL POSITION   │
│ TO ELECTRICALLY DECOUPLE THE FIRST BATTERY MODULE FROM THE SECOND   │
│ BATTERY MODULE                                                      │
└─────────────────────────────────────────────────────────────────────┘
                                    ↓
                                   (C)

TEST SYSTEM FOR A BATTERY PACK AND A METHOD FOR TESTING THE BATTERY PACK

BACKGROUND

The inventors herein have recognized a need for an improved test system for testing a battery pack.

SUMMARY

A test system for a battery pack in accordance with an exemplary embodiment is provided. The battery pack has at least first and second battery modules. The test system includes a high voltage service disconnect assembly having a housing, first and second conductive pins, and an electrically-actuated switch. The housing is configured to secure the first and second conductive pins therein. The electrically-actuated switch is electrically coupled in series between the first and second conductive pins. The first conductive pin is configured to be removably electrically coupled to a voltage terminal of the first battery module. The second conductive pin is configured to be removably electrically coupled to a voltage terminal of the second battery module. The test system further includes a microprocessor operably coupled to the electrically-actuated switch and a sensor. The microprocessor is configured to generate a first signal to induce the electrically-actuated switch to have a closed operational position to electrically couple the first battery module to the second battery module. The sensor is configured to generate a second signal associated with the battery pack. The microprocessor is configured to stop generating the first signal to induce the electrically-actuated switch to have an open operational position to electrically decouple the first battery module from the second battery module when the first signal is greater than a threshold level.

A method for testing a battery pack in accordance with another exemplary embodiment is provided. The battery pack has at least first and second battery modules. The method includes providing a high voltage service disconnect assembly having a housing, first and second conductive pins, and an electrically-actuated switch. The housing is configured to secure the first and second conductive pins therein. The electrically-actuated switch is electrically coupled in series between the first and second conductive pins. The first conductive pin is configured to be removably electrically coupled to a voltage terminal of the first battery module. The second conductive pin is configured to be removably electrically coupled to a voltage terminal of the second battery module. The method includes generating a first signal to induce the electrically-actuated switch to have a closed operation position to electrically couple the first battery module to the second battery module utilizing a microprocessor. The method further includes generating a second signal associated with the battery pack utilizing a sensor. The method further includes stopping the generating of the first signal utilizing the microprocessor to induce the electrically-actuated switch to have an open operational position to electrically decouple the first battery module from the second battery module when the first signal is greater than a threshold level.

BRIEF DESCRIPTION OF THE DRAWINGS

FIGS. 2-6 are flowcharts of a method for testing a battery pack utilizing the test system of FIG. 1 in accordance with another exemplary embodiment.

DETAILED DESCRIPTION

Figure 1:
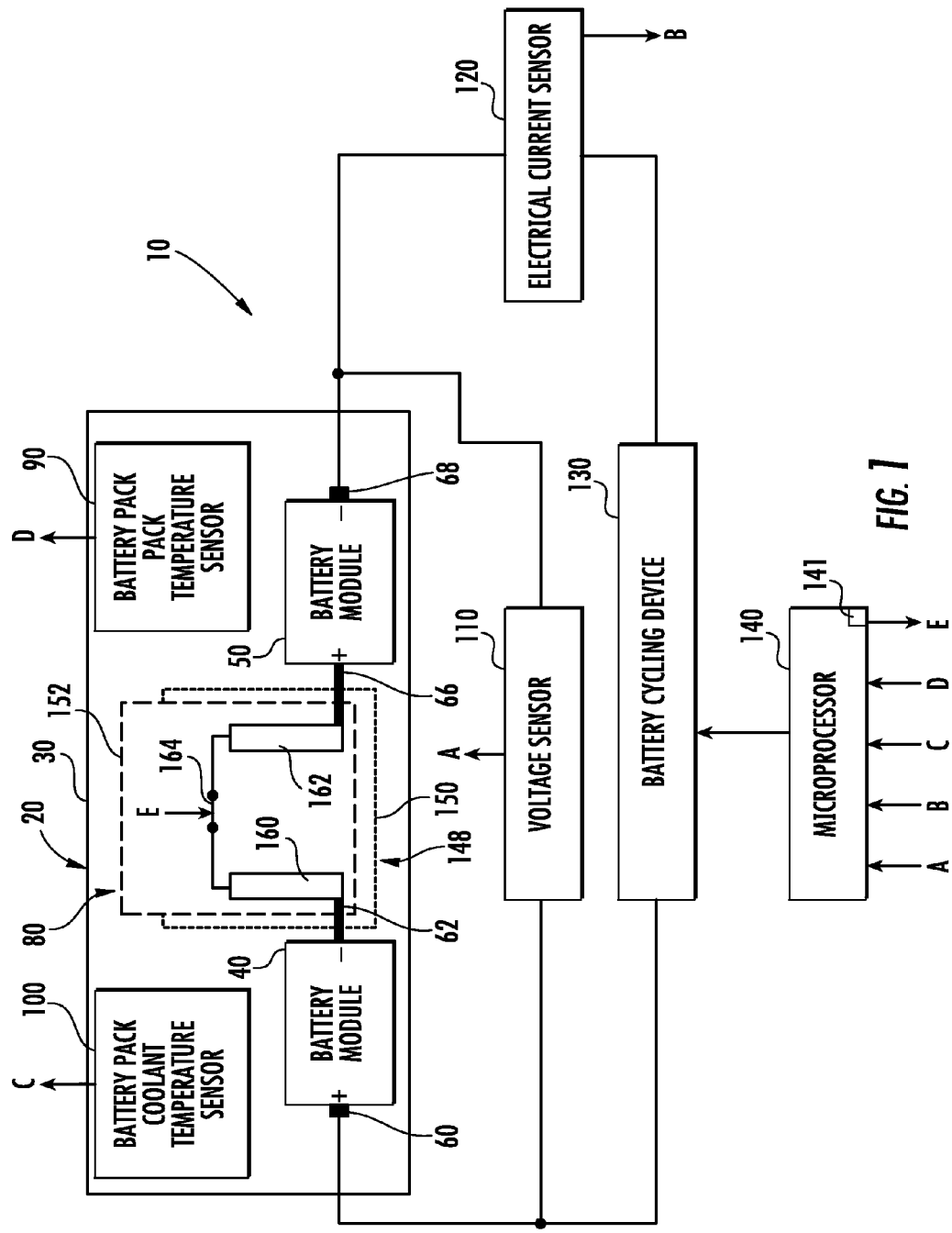
FIG. 1 is a schematic of a test system for a battery pack in accordance with an exemplary embodiment.
Figure 3:
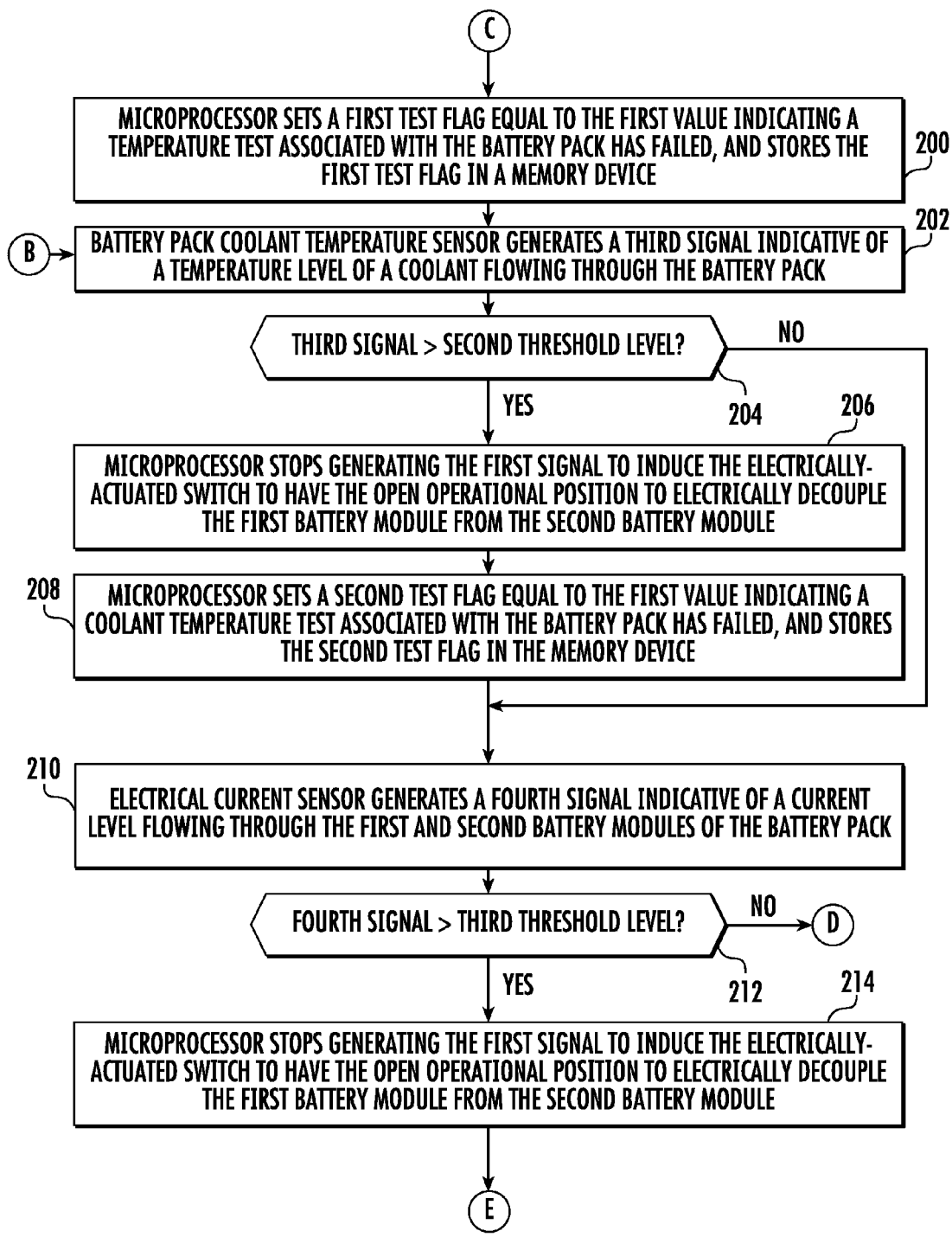
Figure 4:
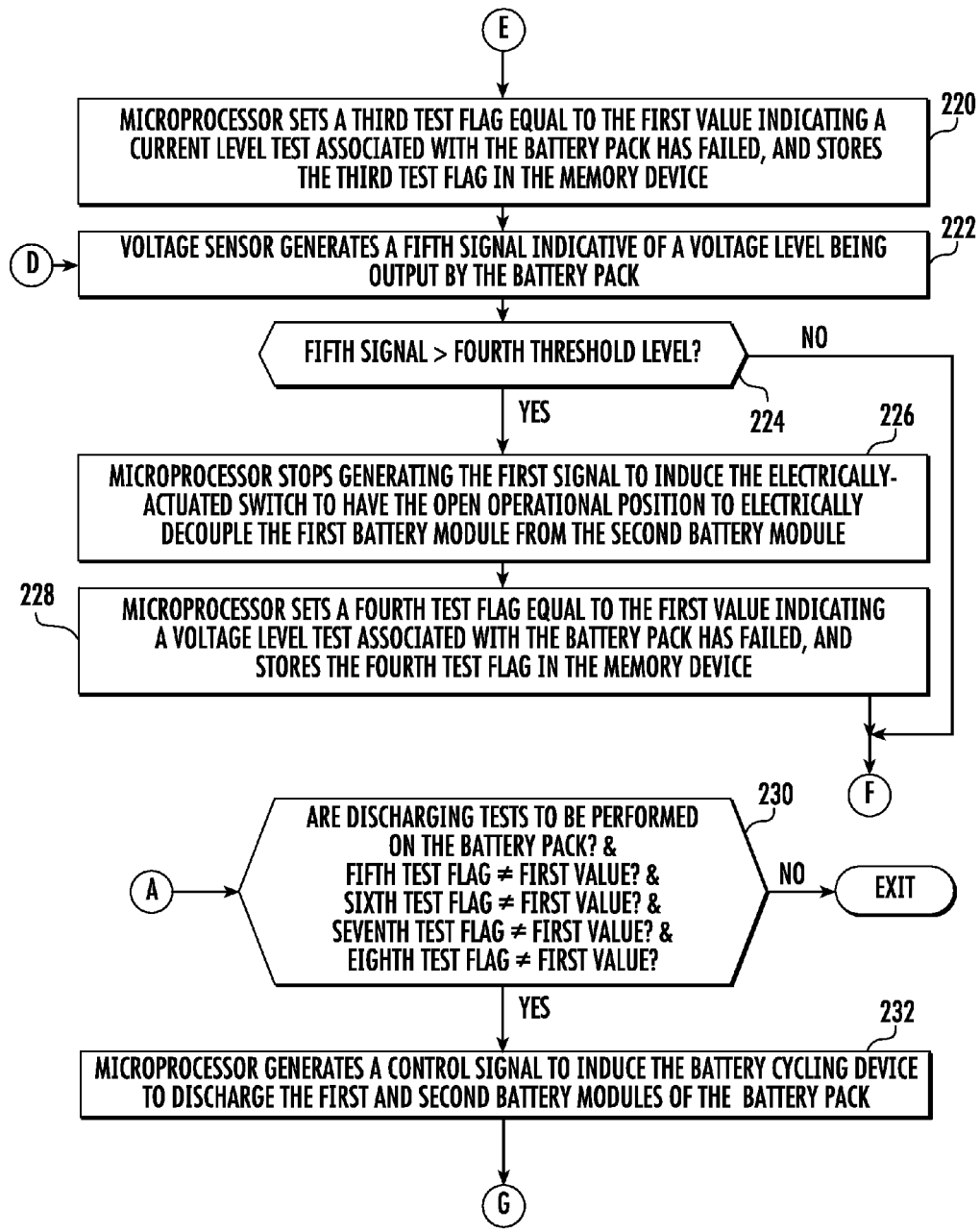
Figure 5:
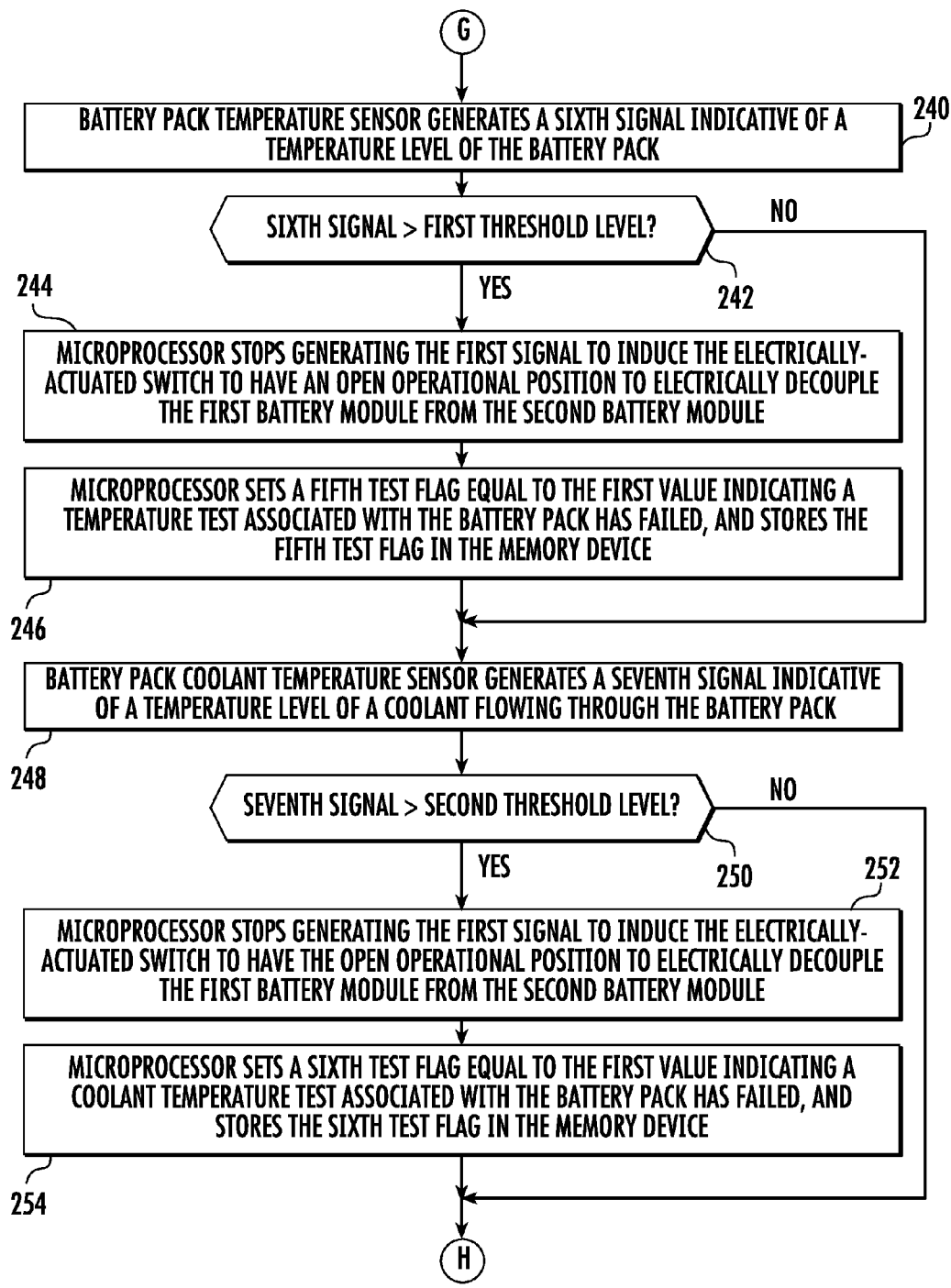
Figure 6:
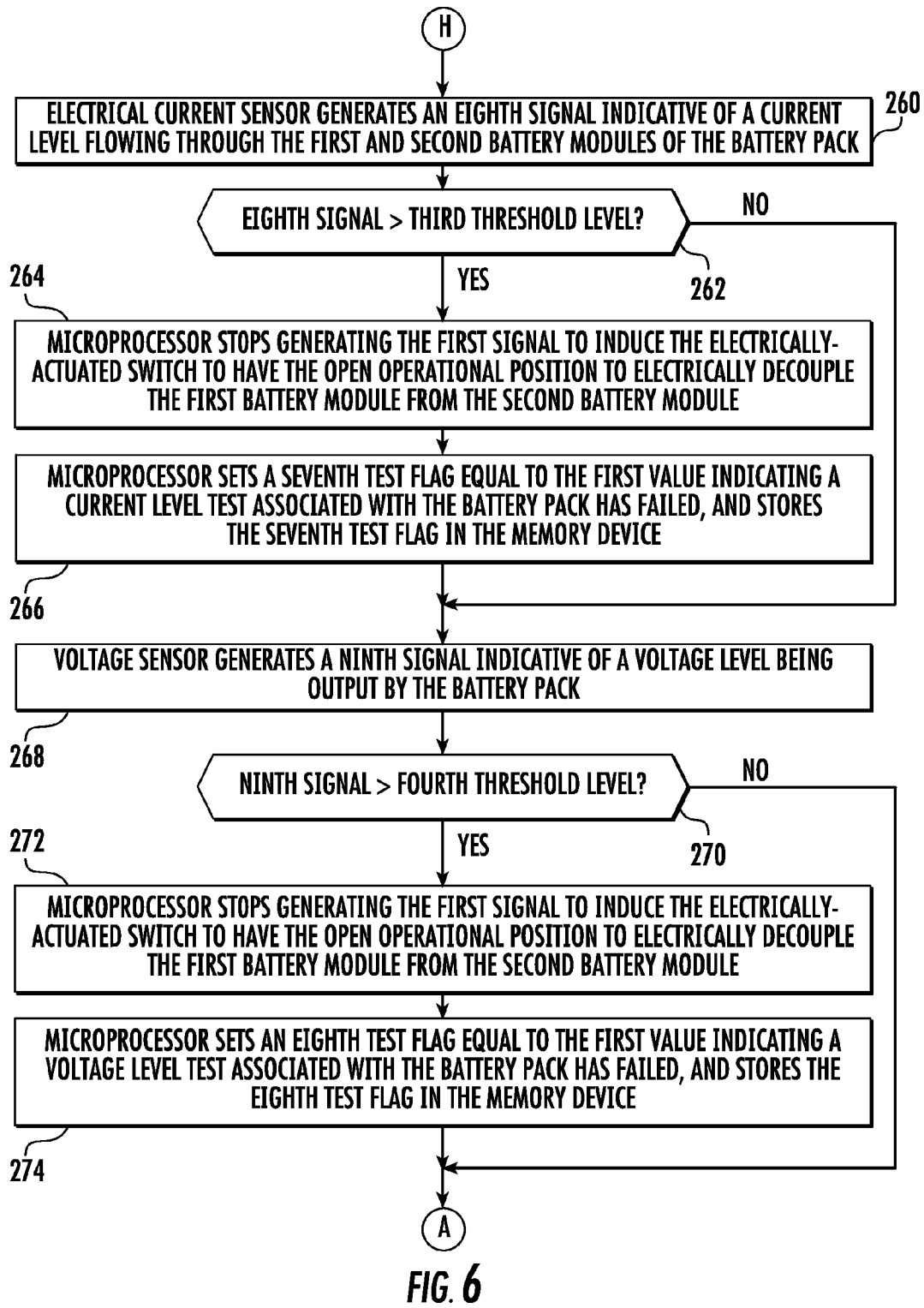

Referring to FIG. 1, a test system 10 for testing a battery pack 20 in accordance with an exemplary embodiment is provided. An advantage of the test system 10 is that the test system 10 utilizes a high voltage service disconnect assembly 80 having an electrically-actuated switch 164 which electrically decouples battery modules within the battery pack 20 when a measured signal associated with the battery pack 20 is greater than the threshold level. Thus, an individual who subsequently performs further testing on the battery pack 20 can do so when the battery pack 20 has a reduced output voltage.

The battery pack 20 is provided to generate electrical power for either an electric vehicle or a hybrid electric vehicle. The battery pack 20 includes a housing 30 and first and second battery modules 40, 50. The first battery module 40 includes a positive voltage terminal 60 and a negative voltage terminal 62. The second battery module 50 includes a positive voltage terminal 66 and a negative voltage terminal 68. The first and second battery modules 40, 50 may be removably electrically coupled together utilizing the high voltage service disconnect assembly 80. In an alternative embodiment, the battery pack 20 has a plurality of additional battery modules electrically coupled in series with the battery module 40, and a plurality of additional battery modules electrically coupled in series with the battery module 50.

The test system 10 includes the high voltage service disconnect assembly 80, a battery pack temperature sensor 90, a battery pack coolant temperature sensor 100, a voltage sensor 110, an electrical current sensor 120, a battery cycling device 130, and a microprocessor 140.

The high voltage service disconnect assembly 80 is configured to selectively electrically couple the battery module 42 to the second battery module 50, and to selectively electrically decouple the first battery module 40 from the second battery module 50. The high voltage service disconnect assembly 80 includes a housing 148, a first conductive pin 160, a second conductive pin 162, and an electrically-actuated switch 164.

The housing 148 includes a stationary housing 150 and a removable housing 152. The stationary housing 150 is configured to receive the removable housing 152 therein. In one exemplary embodiment, the stationary housing 150 and the removable housing 152 are constructed of plastic. Of course, in alternative embodiments, the stationary housing 150 and the removable housing 152 could be constructed of other materials known to those skilled in the art. In one exemplary embodiment, the removable housing 152 is configured to secure the first and second conductive pins 160, 162 therein. In an alternative embodiment, the stationary housing 150 is configured to secure the first and second conductive pins 160, 162 therein.

The electrically-actuated switch 164 is electrically coupled in series between the first and second conductive pins 160, 162. In one exemplary embodiment, the electrically-actuated switch 164 is a normally-open switch. In particular, in one exemplary embodiment, the electrically-actuated switch 164 has a closed operational position in response to receiving a signal from the microprocessor 140, and is configured to transition to an open operational position when the microprocessor 140 stops generating the signal. In one exemplary embodiment, the electrically actuated switch 164 is disposed in the removable housing 152. Also, the electrically-actuated switch 164 is configured to conduct at least 500 Amps when the electrically-actuated switch 164 has a closed operational position.

The first conductive pin 160 is configured to be removably electrically coupled to the voltage terminal 62 of the first battery module 40. The second conductive pin 162 is configured to be removably electrically coupled to the voltage terminal 66 of the second battery module 50. In particular, when the removable housing 152 is disposed within the stationary housing 150, the first conductive pin 160 is electrically coupled to the voltage terminal 62 of the first battery module 40, and the second conductive pin 162 is electrically coupled to the voltage terminal 66 of the second battery module 50. Further, when the removable housing 152 is removed from the stationary housing 150, the first conductive pin 160 is electrically decoupled from the voltage terminal 62, and the second conductive pin 162 is electrically decoupled from the voltage terminal 66.

The battery pack temperature sensor 90 is configured to generate a signal indicative of a temperature level of the battery pack 20 that is received by the microprocessor 140. In one exemplary embodiment, the battery pack temperature sensor 90 is disposed within the housing 30 of the battery pack 20. In an alternative embodiment, the battery pack temperature sensor 90 is disposed outside of the housing 30 and proximate to the housing 30. The battery pack temperature sensor 90 is electrically coupled to the microprocessor 140.

The battery pack coolant temperature sensor 100 is configured to generate a signal indicative of a temperature level of a coolant flowing through the battery pack 20 that is received by the microprocessor 140. In one exemplary embodiment, the battery pack coolant temperature sensor 100 is disposed within the housing 30 of the battery pack 20. In an alternative embodiment, the battery pack coolant temperature sensor 100 is disposed outside of the housing 30 and proximate to the housing 30. The battery pack coolant temperature sensor 100 is electrically coupled to the microprocessor 140.

The voltage sensor 110 is configured to generate a signal indicative of a voltage level being output by the battery pack 20 that is received by the microprocessor 140. In one exemplary embodiment, the voltage sensor 110 is disposed within the housing 30 of the battery pack 20. In an alternative embodiment, the voltage sensor 110 is disposed outside of the housing 30 and proximate to the housing 30. The voltage sensor 110 is electrically coupled between the voltage terminal 60 of the first battery module 40 and the voltage terminal 68 of the second battery module 50. The voltage sensor 110 is further electrically coupled to the microprocessor 140.

The electrical current sensor 120 is configured to generate a signal indicative of a current level flowing through the first and second battery modules 40, 50 of the battery pack 20 that is received by the microprocessor 140. The electrical current sensor 120 is electrically coupled in series between the voltage terminal 68 of the second battery module 50 and the battery cycling device 130. The electrical current sensor 120 is further electrically coupled to the microprocessor 140.

The battery cycling device 130 is configured to electrically charge the first and second battery modules 40, 50 of the battery pack 20 in response to a control signal from the microprocessor 140. Also, the battery cycling device 130 is configured to discharge the first and second battery modules 40, 50 of the battery pack 20 in response to another control signal from the microprocessor 140. The battery cycling device 130 is electrically coupled in series between the electrical current sensor 120 and the voltage terminal 60 of the first battery module 40.

The microprocessor 140 is configured to perform tests on the battery pack 20 which will be explained in greater detail below. The microprocessor 140 is electrically coupled to the battery pack a temperature sensor 90, the battery pack coolant temperature sensor 100, the voltage sensor 110, the electrical current sensor 120, the battery cycling device 130, and the electrically-actuated switch 164. The microprocessor 140 includes a memory 141 configured to store executable software instructions and measured values for performing the tests described herein.

Referring to FIGS. 2-6, a flowchart of a method for testing the battery pack 20 in accordance with another exemplary embodiment is provided. Before executing the step 180, the test flags used by the following method are initialized. In particular, the first, second, third, fourth, fifth, sixth, seventh, and eighth test flags are each initialized to a value not equal to a first value.

At step 180, a user provides the high voltage service disconnect assembly 80 having the housing 148, the first and second conductive pins 160, 162, and the electrically-actuated switch 164. The housing 148 is configured to secure the first and second conductive pins 160, 162 therein. The electrically-actuated switch 164 is electrically coupled in series between the first and second conductive pins 160, 162. The first conductive pin 160 is configured to be removably electrically coupled to the voltage terminal 62 of the first battery module 40. The second conductive pin 162 is configured to be removably electrically coupled to the voltage terminal 68 of the second battery module 50. After step 180, the method advances to step 181.

At step 181, the microprocessor 140 generates a first signal to induce the electrically-actuated switch 164 to have a closed operational position to electrically couple the first battery module 40 to the second battery module 50. After step 181, the method advances to step 182.

At step 182, the microprocessor 140 makes a determination as to whether charging tests are to be performed on battery pack 20, and whether a first test flag is not equal to a first value, and whether a second test flag is not equal to the first value, and whether a third test flag is not equal to the first value, and whether a fourth test flag is not equal to the first value. The microprocessor 140 can determine whether to perform charging tests based on either battery pack operational parameters or a user inputted request. If the value of step 182 equals "yes", the method advances to step 184. Otherwise, the method advances to step 230.

At step 184, the microprocessor 140 generates a control signal to induce the battery cycling device 130 to charge the first and second battery modules 40, 50 of the battery pack 20. After step 184, the method advances to step 186.

At step 186, the battery pack temperature sensor 90 generates a second signal indicative of a temperature level of the battery pack 20. After step 186, the method advances to step 188.

At step 188, the microprocessor 140 makes a determination as to whether the second signal is greater than a first threshold level indicating that the temperature level of the battery pack 20 is greater than a threshold temperature level. If the value of step 188 equals "yes", the method advances to step 190. Otherwise, the method advances to step 202.

At step 190, the microprocessor 140 stops generating the first signal to induce the electrically-actuated switch 164 to have an open operational position to electrically decouple the first battery module 40 from the second battery module 50. After step 190, the method advances to step 200.

At step 200, the microprocessor 140 sets a first test flag equal to the first value indicating a temperature test associated with the battery pack 20 has failed, and stores the first test flag in the memory device 141. After step 200, the method advances to step 202.

At step 202, the battery pack coolant temperature sensor 100 generates a third signal indicative of a temperature level of a coolant flowing through the battery pack 20. After step 202, the method advances to step 204.

At step 204, the microprocessor 140 makes a determination as to whether the third signal is greater than a second threshold level indicating that the coolant temperature level is greater than a threshold coolant temperature level. If the value of step 204 equals "yes", the method advances to step 206. Otherwise, the method advances to step 210.

At step 206, the microprocessor 140 stops generating the first signal to induce the electrically-actuated switch 164 to have the open operational position to electrically decouple the first battery module 40 from the second battery module 50. After step 206, the method advances the step 208.

At step 208, the microprocessor 140 sets a second test flag equal to the first value indicating a coolant temperature test associated with the battery pack 20 has failed, and stores the second test flag in the memory device 141. After step 208, the method advances to step 210.

At step 210, the electrical current sensor 120 generates a fourth signal indicative of a current level flowing through the first and second battery modules 40, 50 of the battery pack 20. After step 210, the method advances to step 212.

At step 212, the microprocessor 140 makes a determination as to whether the fourth signal is greater than a third threshold level indicating that the current level flowing through the battery pack 20 is greater than a threshold current level. If the value of step 212 equals "yes", the method advances to step 214. Otherwise, the method advances to step 222.

At step 214, the microprocessor 140 stops generating the first signal to induce the electrically-actuated switch 164 to have the open operational position to electrically decouple the first battery module 40 from the second battery module 50. After step 214, the method advances to step 220.

At step 220, the microprocessor 140 sets a third test flag equal to the first value indicating a current level test associated with the battery pack 20 has failed, and stores the third test flag in the memory device 141. After step 220, the method advances to step 222.

At step 222, the voltage sensor 110 generates a fifth signal indicative of a voltage level being output by the battery pack 20. After step 222, the method advances to step 224.

At step 224, the microprocessor 140 makes a determination as to whether the fifth signal is greater than a fourth threshold level indicating that the voltage level of the battery pack 20 is greater than a threshold voltage level. If the value of step 224 equals "yes", the method advances to step 226. Otherwise, the method returns to step 182.

At step 226, the microprocessor 140 stops generating the first signal to induce the electrically-actuated switch 164 to have the open operational position to electrically decouple the first battery module 40 from the second battery module 50. After step 226, the method advances to step 228.

At step 228, the microprocessor 140 sets a fourth test flag equal to the first value indicating a voltage level test associated with the battery pack 20 has failed, and stores the fourth test flag in the memory device 141. After step 228, the method returns to step 182.

Referring again to step 182, the value of step 182 equals "no", the method advances to step 230.

At step 230, the microprocessor 140 makes a determination as to whether discharging tests are to be performed on the battery pack 20, and whether a fifth test flag is not equal to the first value, and whether a sixth test flag is not equal to the first value, and whether a seventh test flag is not equal to the first value, and whether an eighth test flag is not equal to the first value. The microprocessor 140 can determine whether to perform discharging tests based on either battery pack operational parameters or a user inputted request. If the value of step 230 equals "yes", the method advances to step 232. Otherwise, the method is exited.

At step 232, the microprocessor 140 generates a control signal to induce the battery cycling device 130 to discharge the first and second battery modules 40, 50 of the battery pack 20. After step 232, the method advances to step 240.

At step 240, the battery pack temperature sensor 90 generates a sixth signal indicative of a temperature level of the battery pack 20. After step 240, the method advances to step 242.

At step 242, the microprocessor 140 makes a determination as to whether the sixth signal is greater than the first threshold level indicating that the temperature level of the battery pack 20 is greater than a threshold temperature level. If the value of step 242 equals "yes", the method advances to step 244. Otherwise, the method advances to step 248.

At step 244, the microprocessor 140 stops generating the first signal to induce the electrically-actuated switch 164 to have an open operational position to electrically decouple the first battery module 40 from the second battery module 50. After step 244, the method advances to step 246.

At step 246, the microprocessor 140 sets a fifth test flag equal to the first value indicating a temperature test associated with the battery pack 20 has failed, and stores the fifth test flag in the memory device 141. After step 246, the method advances to step 248.

At step 248, the battery pack coolant temperature sensor 100 generates a seventh signal indicative of a temperature level of a coolant flowing through the battery pack 20. After step 248, the method advances to step 250.

At step 250, the microprocessor 140 makes a determination as to whether the seventh signal is greater than the second threshold level indicating that the coolant temperature level is greater than a threshold coolant temperature level. If the value of step 250 equals "yes", the method advances to step 252. Otherwise, the method advances to step 260.

At step 252, the microprocessor 140 stops generating the first signal to induce the electrically-actuated switch 164 to have the open operational position to electrically decouple the first battery module 40 from the second battery module 50. After step 252, the method advances to step 254.

At step 254, the microprocessor 140 sets a sixth test flag equal to the first value indicating a coolant temperature test associated with the battery pack 20 has failed, and stores the sixth test flag in the memory device 141. After step 254, the method advances to step 260.

At step 260, the electrical current sensor 120 generates an eighth signal indicative of a current level flowing through the first and second battery modules 40, 50 of the battery pack 20. After step 260, the method advances to step 262.

At step 262, the microprocessor 140 makes a determination as to whether the eighth signal is greater than the third threshold level indicating that the current level flowing through the battery pack 20 is greater than a threshold current level. If the value of step 262 equals "yes", the method advances to step 264. Otherwise, the method advances to step 268.

At step 264, the microprocessor 140 stops generating the first signal to induce the electrically-actuated switch 164 to have the open operational position to electrically decouple the first battery module 40 from the second battery module 50.

After step 264, the method advances to step 266.

At step 266, the microprocessor 140 sets a seventh test flag equal to the first value indicating a current level test associated with the battery pack 20 has failed, and stores the seventh test flag in the memory device 141. After step 266, the method advances to step 268.

At step 268, the voltage sensor 110 generates a ninth signal indicative of a voltage level being output by the battery pack 20. After step 268, the method advances to step 270.

At step 270, the microprocessor 140 makes a determination as to whether the ninth signal is greater than the fourth threshold level indicating that the voltage level of the battery pack 20 is greater than a threshold voltage level. If the value of step 270 equals "yes", the method advances to step 272. Otherwise, the method returns to step 230.

At step 272, the microprocessor 140 stops generating the first signal to induce the electrically-actuated switch 164 to have the open operational position to electrically decouple the first battery module 40 from the second battery module 50. After step 272, the method advances to step 274.

At step 274, the microprocessor 140 sets an eighth test flag equal to the first value indicating a voltage level test associated with the battery pack 20 has failed, and stores the eighth test flag in the memory device 141. After step 274, the method returns to step 230.

The above-described method can be at least partially embodied in the form of one or more computer readable media having computer-executable instructions for practicing the method. The computer-readable media can comprise one or more of the following: hard drives, flash memory, CD-ROMs, and other computer-readable media known to those skilled in the art; wherein, when the computer-executable instructions are loaded into and executed by one or more microprocessors or computers, the one or more microprocessors or computers become an apparatus specifically programmed for practicing the invention.

The test system and the method for testing a battery pack provide a substantial advantage over other test systems and methods. In particular, the test system and the method provide a technical effect of utilizing a high voltage service disconnect assembly having an electrically-actuated switch which electrically decouples battery modules within the battery pack when a measured signal associated with the battery pack is greater than the threshold level. Thus, an individual who subsequently performs further testing on the battery pack can do so when the battery pack has a reduced output voltage.

While the claimed invention has been described in detail in connection with only a limited number of embodiments, it should be readily understood that the invention is not limited to such disclosed embodiments. Rather, the claimed invention can be modified to incorporate any number of variations, alterations, substitutions or equivalent arrangements not heretofore described, but which are commensurate with the spirit and scope of the invention. Additionally, while various embodiments of the claimed invention have been described, it is to be understood that aspects of the invention may include only some of the described embodiments. Accordingly, the claimed invention is not to be seen as limited by the foregoing description.

What is claimed is:

1. A test system for a battery pack, the battery pack having at least first and second battery modules, comprising:
a high voltage service disconnect assembly having a stationary housing, a removable housing configured to be removable from the stationary housing, first and second conductive pins, and an electrically-actuated switch; the removable housing being configured to secure the first and second conductive pins therein, the electrically-actuated switch being electrically coupled in series between the first and second conductive pins, the electrically-actuated switch being disposed in the removable housing, the first conductive pin being electrically coupled to a voltage terminal of the first battery module when the removable housing is disposed in the stationary housing; the first conductive pin being electrically decoupled from the voltage terminal of the first batter module when the removable housing is removed from the stationary housing; the second conductive pin being electrically coupled to a voltage terminal of the second battery module when the removable housing is disposed in the stationary housing; the second conductive pin being electrically decoupled from the voltage terminal of the second battery module when the removable housing is removed from the stationary housing;
a microprocessor operably coupled to the electrically-actuated switch and a sensor, the microprocessor configured to generate a first signal to induce the electrically-actuated switch to have a closed operational position to electrically couple the first battery module to the second battery module;
the sensor configured to generate a second signal associated with the battery pack; and
the microprocessor configured to stop generating the first signal to induce the electrically-actuated switch to have an open operational position to electrically decouple the first battery module from the second battery module when the first signal is greater than a threshold level.

2. The test system of claim 1, wherein the microprocessor is further configured to set a test flag equal to a first value indicating a testing failure associated with the battery pack when the second signal is greater than the threshold level.

3. The test system of claim 1, further comprising a battery cycling device configured to charge and discharge the first and second battery modules of the battery pack.

4. The test system of claim 3, wherein the sensor is a battery pack temperature sensor, the second signal being indicative of a temperature level of the battery pack when the battery pack is being charged.

5. The test system of claim 3, wherein the sensor is a battery pack temperature sensor, the second signal being indicative of a temperature level of the battery pack when the battery pack is being discharged.

6. The test system of claim 3, wherein the sensor is a battery pack coolant temperature sensor, the second signal being indicative of a temperature level of a coolant flowing through the battery pack when the battery pack is being charged.

7. The test system of claim 3, wherein the sensor is a battery pack coolant temperature sensor, the second signal being indicative of a temperature level of a coolant flowing through the battery pack when the battery pack is being discharged.

8. The test system of claim 3, wherein the sensor is an electrical current sensor, the second signal being indicative of a current level flowing through the first and second battery modules of the battery pack when the battery pack is being charged.

9. The test system of claim 3, wherein the sensor is an electrical current sensor, the second signal being indicative of a current level flowing through the first and second battery modules of the battery pack when the battery pack is being discharged.

10. The test system of claim 3, wherein the sensor is a voltage sensor, the second signal being indicative of a voltage level being output by the battery pack when the battery pack is being charged.

11. The test system of claim 3, wherein the sensor is a voltage sensor, the second signal being indicative of a voltage level being output by the battery pack when the battery pack is being discharged.

12. The test system of claim 1, wherein the electrically-actuated switch is configured to conduct at least 500 Amps when the electrically-actuated switch has the closed operational position.

13. A method for testing a battery pack, the battery pack having at least first and second battery modules, comprising:
providing a high voltage service disconnect assembly having a stationary housing, a removable housing, first and second conductive pins, and an electrically-actuated switch, the removable housing being configured to secure the first and second conductive pins therein, the electrically-actuated switch being electrically coupled in series between the first and second conductive pins, the electrically-actuated switch being disposed in the removable housing, the first conductive pin being electrically coupled to a voltage terminal of the first battery module when the removable housing is disposed in the stationary housing, the first conductive pin being electrically decoupled from the voltage terminal of the first battery module when the removable housing is removed from the stationary housing; the second conductive pin being electrically coupled to a voltage terminal of the second battery module when the removable housing is disposed in the stationary housing, the second conductive pin being electrically decoupled from the voltage terminal of the second battery module when the removable housing is removed from the stationary housing;
inserting the removable housing of the high voltage service disconnect assembly into the stationary housing of the high voltage service disconnect assembly such that the first conductive pin is electrically coupled to the voltage terminal of the first battery module, and the second conductive pin is electrically coupled to the voltage terminal of the second battery module;
generating a first signal to induce the electrically-actuated switch to have a closed operation position to electrically couple the first battery module to the second battery module utilizing a microprocessor;
generating a second signal associated with the battery pack utilizing a sensor; and
stopping the generating of the first signal utilizing the microprocessor to induce the electrically-actuated switch to have an open operational position to electrically decouple the first battery module from the second battery module when the first signal is greater than a threshold level.

14. The test system of claim 13, further comprising setting a test flag equal to a first value utilizing the microprocessor indicating a testing failure associated with the battery pack when the second signal is greater than the threshold level.

15. The method of claim 13, further comprising charging the first and second battery modules of the battery pack utilizing a battery cycling device.

16. The method of claim 15, wherein the sensor is a battery pack temperature sensor, and the generating the second signal comprises generating the second signal indicative of a temperature level of the battery pack when the battery pack is being charged.

17. The method of claim 15, wherein the sensor is a battery pack coolant temperature sensor, and the generating the second signal comprises generating the second signal indicative of a temperature level of a coolant flowing through the battery pack when the battery pack is being charged.

18. The method of claim 15, wherein the sensor is an electrical current sensor, and the generating the second signal comprises generating the second signal indicative of a current level flowing through the first and second battery modules of the battery pack when the battery pack is being charged.

19. The method of claim 15, wherein the sensor is a voltage sensor, the generating the second signal comprises generating the second signal indicative of a voltage level being output by the battery pack when the battery pack is being charged.

20. The method of claim 13, further comprising discharging the first and second battery modules of the battery pack utilizing the battery cycling device.

21. The method of claim 20, wherein the sensor is a battery pack temperature sensor, and the generating the second signal comprises generating the second signal indicative of a temperature level of the battery pack when the battery pack is being discharged.

22. The method of claim 20, wherein the sensor is a battery pack coolant temperature sensor, and the generating the second signal comprises generating the second signal indicative of a temperature level of a coolant flowing through the battery pack when the battery pack is being discharged.

23. The method of claim 20, wherein the sensor is an electrical current sensor, and the generating the second signal comprises generating the second signal indicative of a current level flowing through the first and second battery modules of the battery pack when the battery pack is being discharged.

24. The method of claim 20, wherein the sensor is a voltage sensor, and the generating the second signal comprises generating the second signal indicative of a voltage level being output by the battery pack when the battery pack is being discharged.

* * * * *